United States Patent
Jan et al.

(10) Patent No.: US 9,520,494 B2
(45) Date of Patent: Dec. 13, 2016

(54) VERTICAL NON-PLANAR SEMICONDUCTOR DEVICE FOR SYSTEM-ON-CHIP (SOC) APPLICATIONS

(71) Applicant: Intel Corporation, Santa Clara, CA (US)

(72) Inventors: Chia-Hong Jan, Portland, OR (US); Walid M. Hafez, Portland, OR (US); Curtis Tsai, Beaverton, OR (US); Jeng-Ya D. Yeh, Portland, OR (US); Joodong Park, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/913,326

(22) PCT Filed: Sep. 26, 2013

(86) PCT No.: PCT/US2013/062015
§ 371 (c)(1),
(2) Date: Feb. 19, 2016

(87) PCT Pub. No.: WO2015/047281
PCT Pub. Date: Apr. 2, 2015

(65) Prior Publication Data
US 2016/0211369 A1    Jul. 21, 2016

(51) Int. Cl.
| | |
|---|---|
| *H01L 29/772* | (2006.01) |
| *H01L 29/78* | (2006.01) |
| *H01L 27/12* | (2006.01) |
| *H01L 29/06* | (2006.01) |
| *H01L 29/66* | (2006.01) |

(52) U.S. Cl.
CPC ............ *H01L 29/7827* (2013.01); *H01L 27/12* (2013.01); *H01L 29/0653* (2013.01); *H01L 29/66545* (2013.01); *H01L 29/66666* (2013.01)

(58) Field of Classification Search
CPC ............... H01L 21/823487; H01L 21/823885; H01L 29/7827; H01L 29/66666
See application file for complete search history.

(56) References Cited

U.S. PATENT DOCUMENTS

| | | | |
|---|---|---|---|
| 2008/0135935 A1* | 6/2008 | Cho | H01L 21/845 257/347 |
| 2008/0142881 A1 | 6/2008 | Mikasa | |
| 2008/0237637 A1 | 10/2008 | Quyang et al. | |

(Continued)

OTHER PUBLICATIONS

International Search Report and Written Opinion from PCT/US2013/062015 mailed Jun. 27, 2014, 10 pgs.

*Primary Examiner* — Bryan Junge
(74) *Attorney, Agent, or Firm* — Blakely, Sokoloff, Taylor & Zafman LLP

(57) ABSTRACT

Vertical non-planar semiconductor devices for system-on-chip (SoC) applications and methods of fabricating vertical non-planar semiconductor devices are described. For example, a semiconductor device includes a semiconductor fin disposed above a substrate, the semiconductor fin having a recessed portion and an uppermost portion. A source region is disposed in the recessed portion of the semiconductor fin. A drain region is disposed in the uppermost portion of the semiconductor fin. A gate electrode is disposed over the uppermost portion of the semiconductor fin, between the source and drain regions.

22 Claims, 11 Drawing Sheets

(56) References Cited

U.S. PATENT DOCUMENTS

| | | | |
|---|---|---|---|
| 2013/0049115 A1* | 2/2013 | Cheng | H01L 29/66803 257/347 |
| 2014/0151804 A1* | 6/2014 | Meiser | H01L 29/66795 257/347 |
| 2015/0069458 A1* | 3/2015 | Li | H01L 29/66795 257/105 |

* cited by examiner

VERTICAL NON-PLANAR SEMICONDUCTOR DEVICE FOR SYSTEM-ON-CHIP (SOC) APPLICATIONS

CLAIM OF PRIORITY

This application is a U.S. National Phase application under 35 U.S.C. §371 of International Application No. PCT/US2013/062015, filed Sep. 26, 2013, entitled "VERTICAL NON-PLANAR SEMICONDUCTOR DEVICE FOR SYSTEM-ON-CHIP (SOC) APPLICATIONS" the entire contents of which are incorporated herein by reference.

TECHNICAL FIELD

Embodiments of the invention are in the field of semiconductor devices and processing and, in particular, vertical non-planar semiconductor devices for system-on-chip (SoC) applications and methods of fabricating vertical non-planar semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as fin field effect transistors (fin-FETs), have become more prevalent as device dimensions continue to scale down. In conventional processes, fin-FETs are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
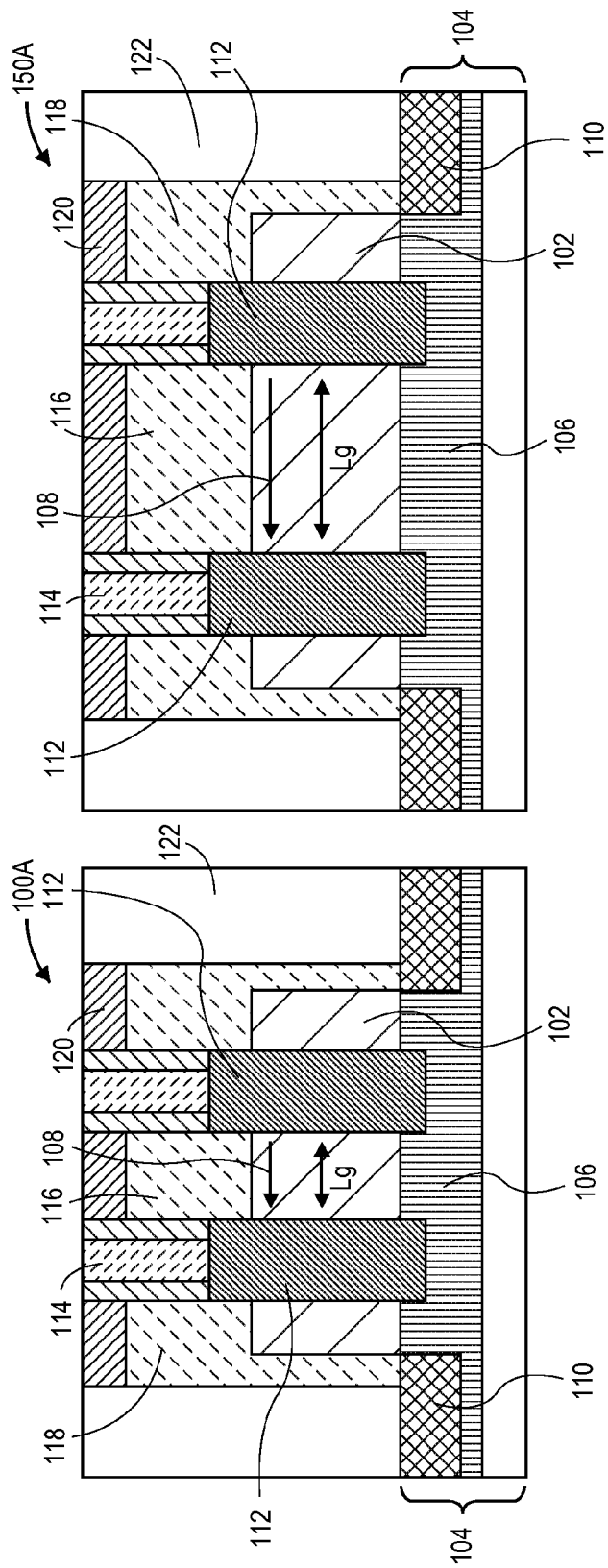
FIG. 1A illustrates cross-sectional views of a standard low-voltage transistor and a standard analog/low-leakage transistor.

Vertical non-planar semiconductor devices for system-on-chip (SoC) applications and methods of fabricating vertical non-planar semiconductor devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to fabricating and achieving vertical capabilities of a fin-FET architecture to generate a vertical fin-FET transistor. Vertical fin-FET transistors such as those described herein may be suitable for system-on-chip (SoC) applications. Other attributes or application may include, but are not limited to, analog, high-voltage, input/output and low-leakage semiconductor devices. As will be understood through the description below, the vertical fin-FET design may be referred to as a folded transistor.

To provide context, presently, (SoC) process technologies are focused on aggressively scaling the gate length (Lg) of transistors to provide performance and area scaling in accordance with Moore's Law. One adverse effect of such lateral scaling is that the support for low leakage and high voltage devices—both of which are critical for successful SoC processss—can become difficult due to the divergent transistor architecture of these transistors compared to the minimum design rule (nominal) transistor. The fabrication of long channel lengths to enable high voltage reliability and low leakage operation may prove difficult and costly from both a process and area standpoint. In an example, one solution for current SoC technologies to support high voltage input/output (I/O) devices is to employ a multiple gate length process in which a nominal (minimum Lg) gate is fabricated along side a low-leakage or high-voltage compliant gate, constructed on a wider pitch with a longer Lg. The integration of such a multiple gate length process is, however, complicated and costly, particularly as the disparity between the gate length of the nominal minimum design rule transistor and the high voltage I/O devices increases.

In order to address above issues, more specifically, one or more embodiments described herein offer advantages over the current art. First, area scaling is improved, as the large lateral sizes of the prior art are replaced with a more compact vertical implementation (improved aerial density). Second, the process integration is simpler, as there is no longer a need to support wide gate lengths along side minimum gate lengths. This can greatly reduce the patterning complexity as well as the variation seen during processing (such as low to high density ranges during CMP). Third, the vertical transistor as described herein is scalable. In one such embodiment, as fin heights and vertical integration increase, the available channel lengths of the vertical transistor increase, providing wider options for transistor gate-length selection.

As a reference point, FIG. 1A illustrates cross-sectional views of a standard low-voltage transistor 100A and a standard analog/low-leakage transistor 150A. Referring to FIG. 1A, both devices 100A and 150A are N-type and are formed on a fin 102 formed on a substrate 104. In the case where a bulk substrate is used, such as a bulk silicon substrate, a P-subdoping region 106 provides electrical isolation between the fin and the bulk substrate, and the current path is shown as arrow 108. Shallow trench isolation regions 110 may also be included. Source and drain regions 112 are included in the fin (shown here as epitaxial regions), to which source/drain contacts 114 are coupled. A gate electrode 116 wraps the fin 102 between the source and drain regions 112. Additional gate lines 118 may also be included, as is depicted. As is also depicted, a dielectric gate cap layer 120 and an inter-layer dielectric layer 122 may also be included. On a given common substrate, the difference between devices 100A and 150A is the gate length (Lg).

By contrast, in accordance with an embodiment of the present invention, vertical capabilities of a fin-FET architecture are exploited to generate a vertical fin-FET transistor. The vertical fin-FET transistor can implemented to overcome many of the limitations and process complexities associated with the above described state-of-the-art approaches. In one such embodiment, the vertical nature of the fin-FET architecture is utilized to form a channel where the current runs vertically, rather than the typical horizontal (with respect to the silicon substrate) orientation. A conventional fin-FET transistor employs an aligned (e.g., same height) source and drain contact which wraps around the fin, and current conduction is controlled electrostatically by the gate electrode. Instead, in accordance with an embodiment of the present invention, standard metal oxide semiconductor (MOS) electrode configurations and physics are utilized; however, the current conduction from the source to the drain is vertical along the fin. In a specific such embodiment, the vertical conductor path is achieved by recessing the drain contact to the sub-fin and introducing an engineered sub-fin doping scheme to enable transistor functionality.

Figure 1B:
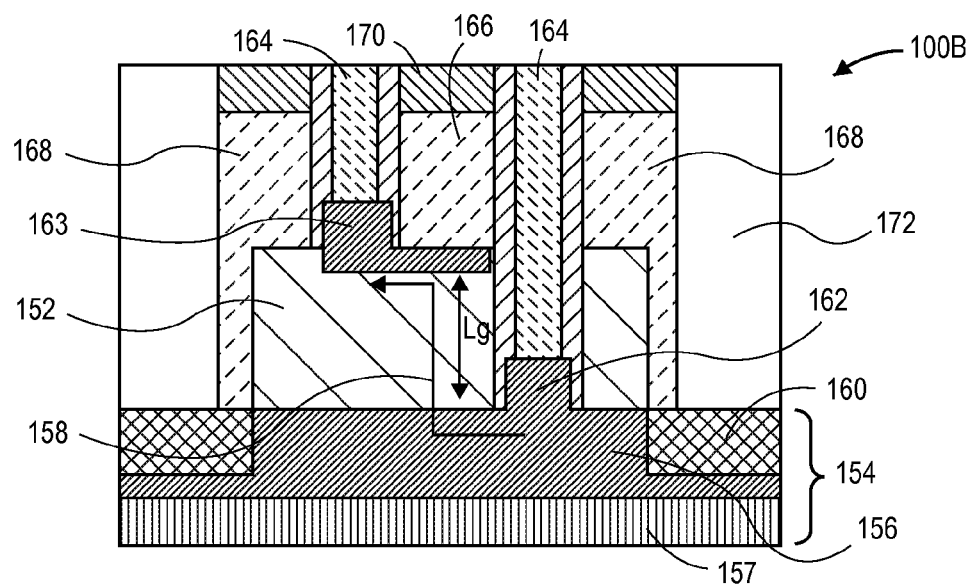
FIG. 1B illustrates a cross-sectional view of vertical fin-FET transistor, in accordance with an embodiment of the present invention.

In a first aspect, FIG. 1B illustrates a cross-sectional view of vertical fin-FET transistor 100B, in accordance with an embodiment of the present invention. Referring to FIG. 1B, device 100B is N-type and is formed on a fin 152 formed on a substrate 154. In the case where a bulk substrate is used, such as a bulk silicon substrate, an N-subdoping region 156 is provided above a P-isolation retro doping region 157. Shallow trench isolation regions 160 may also be included. Source region 162 and drain region 163 are included in the fin 152 (shown here as epitaxial regions), to which source/drain contacts 164 are coupled. Different from a non-vertical fin-FET (as was described in association with FIG. 1A), the source region 163 is recessed deep into the fin 152 relative to the drain 163. A gate electrode 166 (which includes a gate dielectric layer not shown) wraps the fin 152 between the source region 162 and drain region 163. Additional gate lines 168 may also be included, as is depicted. As is also depicted, a dielectric gate cap layer 170 and an inter-layer dielectric layer 172 may also be included. The current path from source region 162 to drain region 163 is shown as arrow 168, and has a substantially vertical component (as oriented to the underlying substrate. Also, the gate length (Lg) is taken as vertical, as opposed to the horizontal gate length measurement of the devices 100A and 150A of FIG. 1A.

In an embodiment, the semiconductor structure or device 100B is a non-planar device such as, but not limited to, a fin-FET or a tri-gate device. In such an embodiment, a corresponding semiconducting channel region is composed of or is formed in a three-dimensional body or fin. In one such embodiment, the gate electrode(s) surround at least a top surface and a pair of sidewalls of the three-dimensional body. FIGS. 2A-2E illustrate cross-sectional views of a vertical transistor, as taken from various orientations, to better illustrate the concepts described in association with FIG. 1B, in accordance with an embodiment of the present invention.

Figure 2A:
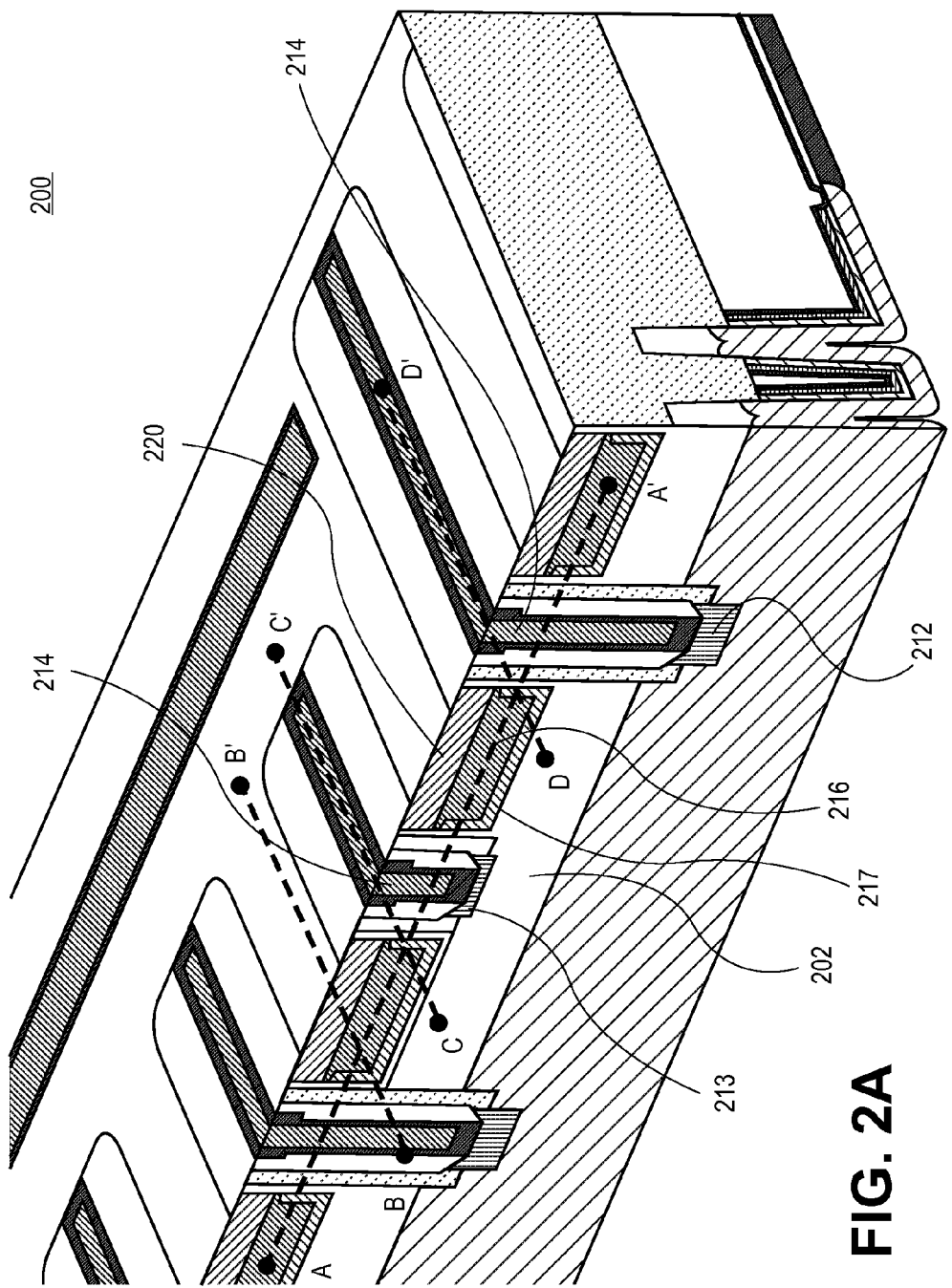
FIGS. 2A-2E illustrate cross-sectional views of a vertical transistor, as taken from various orientations, to better illustrate the concepts described in association with FIG. 1B, in accordance with an embodiment of the present invention.

FIG. 2A illustrates a three-dimensional cross-sectional view of a vertical fin-FET transistor 200 formed on a fin 202. Source region 212 and drain region 213 are included in the fin 202, to which source/drain contacts 214 are coupled. The source region 212 is recessed deep into the fin 202 relative to the drain region 213. A gate electrode 216 (which includes a gate dielectric layer 217) wraps the fin 202 between the source region 212 and drain region 213. As is also depicted, a dielectric gate cap layer 220 is also included.

Figure 2B:
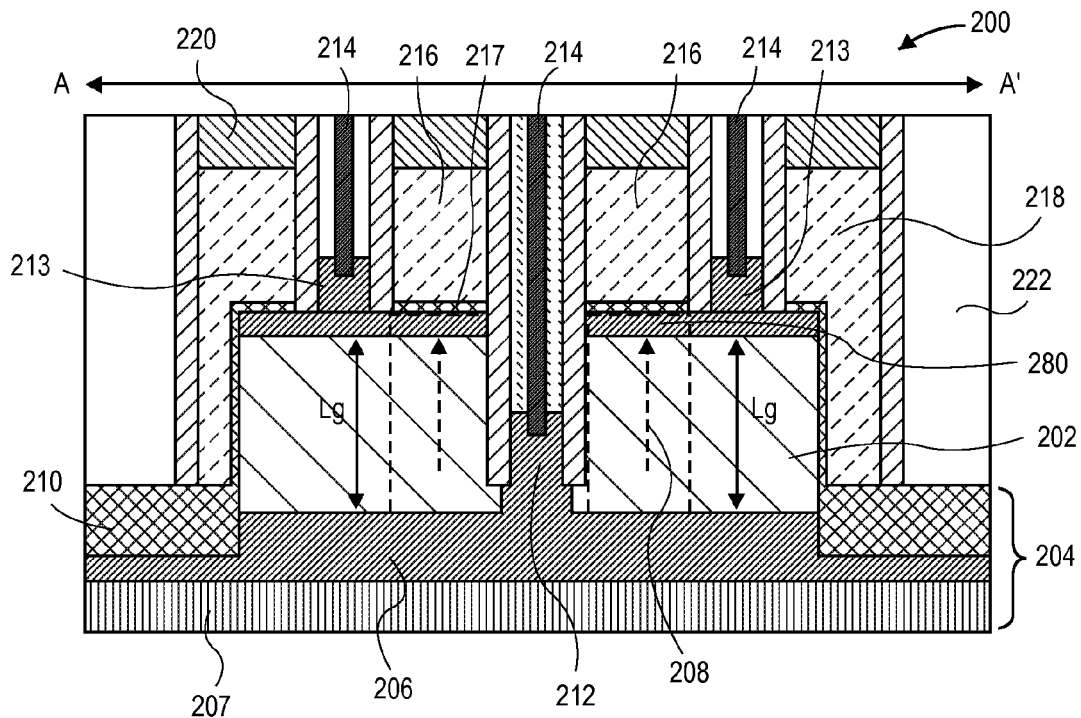

FIG. 2B illustrates a cross-sectional view taken along the A-A' axis of the semiconductor device of FIG. 2A, resulting in an orthogonal cut across the gate (OGD orientation) through fin orientation. Referring to FIG. 2B, as viewed, device 200 is N-type and is formed on the fin 202 formed on a substrate 204. In the case where a bulk substrate is used, such as a bulk silicon substrate, an N-subdoping region 206 is provided above a P-isolation retro doping region 207. An upper N-doping region 280 is also included in the upper portion of the fin 202. Shallow trench isolation regions 210 may also be included. Source region 212 and drain regions 213 are included in the fin 202 (shown here as epitaxial regions), to which source/drain contacts 214 are coupled. The source region 212 is recessed deep into the fin 202 relative to the drain regions 213. Gate electrodes 216 (which includes a gate dielectric layer 217) wrap the fin 202 between the source region 212 and respective drain regions 213. Additional gate lines 218 may also be included, as is depicted. As is also depicted, a dielectric gate cap layer 220 and an inter-layer dielectric layer 222 may also be included. The current path from source region 212 to drain regions 213 is shown as arrows 208, and has a substantially vertical component (as oriented to the underlying substrate) 204. The gate length (Lg) is taken as vertical, as is depicted.

Figure 2C:
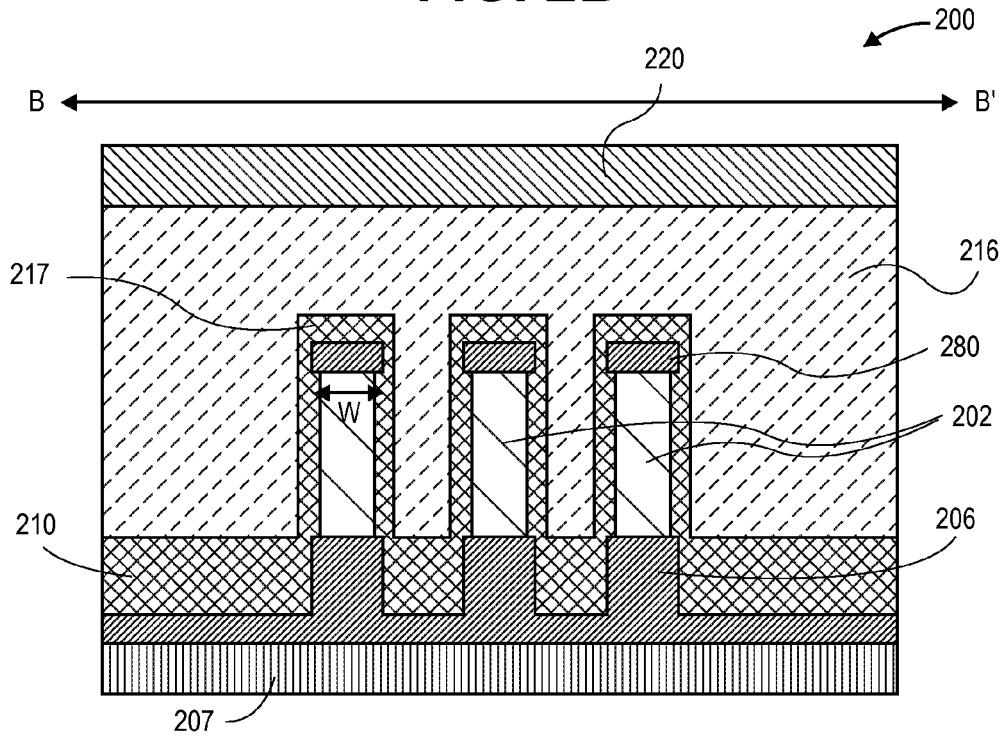

FIG. 2C illustrates a cross-sectional view taken along the B-B' axis of the semiconductor device of FIG. 2A, resulting in a perpendicular cut along the gate (PGD orientation) through gate electrode orientation. Referring to FIG. 2C, as viewed, device 200 includes several fins 202, each having a width (W), including the lower N-subdoping region 206 and the upper N-doping region 280. The fins 202 are disposed above the P-isolation retro doping region 207. Shallow trench isolation regions 210 between fins 202 are also viewed from this perspective. A gate electrode 216 (which includes a gate dielectric layer 217) wrap the fin 202 between the source region 212 and respective drain regions 213. As is also depicted, a dielectric gate cap layer 220 is also included.

Figure 2D:
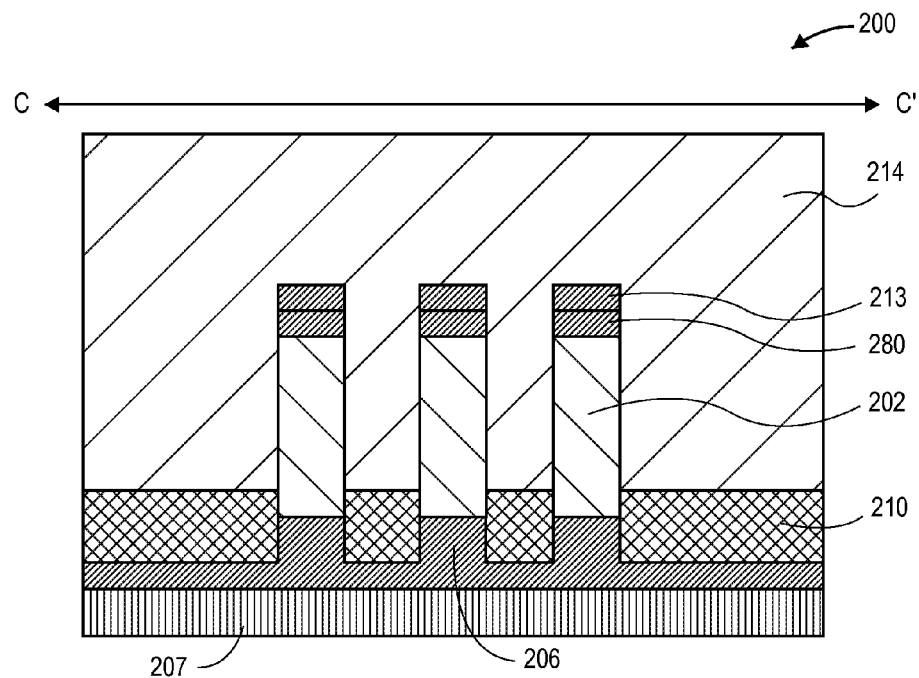

FIG. 2D illustrates a cross-sectional view taken along the C-C' axis of the semiconductor device of FIG. 2A, resulting in a perpendicular cut along the gate (PGD orientation) through drain contact orientation. Referring to FIG. 2D, as viewed, device 200 includes several fins 202 including the upper drains 213. The fins 202 are disposed above the P-isolation retro doping region 207. Shallow trench isolation regions 210 between fins 202 are also viewed from this perspective. Since the drain region 213 is formed in the upper portion of the fins 202, the entire fin height is seen from this perspective. Thus, a drain contact 214 wraps the fins 202 at the highest points of the fins 202.

Figure 2E:
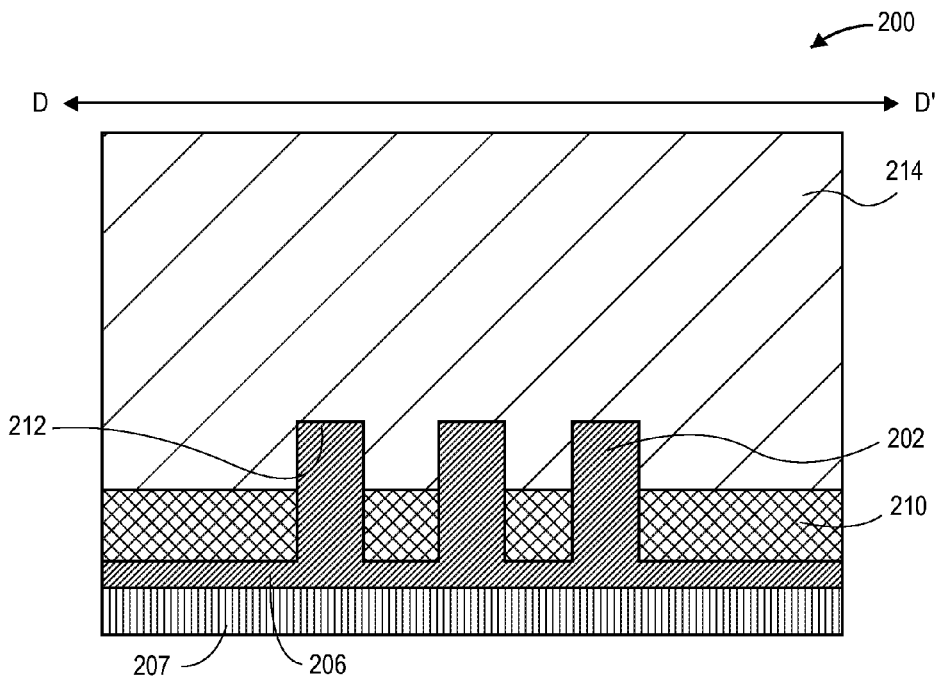

FIG. 2E illustrates a cross-sectional view taken along the D-D' axis of the semiconductor device of FIG. 2A, resulting in a perpendicular cut along the gate (PGD orientation) through source contact orientation. Referring to FIG. 2E, as viewed, device 200 includes several fins 202 including the lower source regions 212. The fins 202 include the N-doping region 206 are disposed above the P-isolation retro doping region 207. Shallow trench isolation regions 210 between fins 202 are also viewed from this perspective. Since the source region 212 is formed in the recessed portion of the fins 202, only a partial fin height is seen from this perspective. Thus, a source contact 214 wraps the fins 202 at the lowest points of the fins 202.

In another aspect, a semiconductor fabrication scheme can involve fabrication of a vertical transistor. As an example, FIGS. 3A-3K illustrate cross-sectional view of various operations in a method of fabricating a vertical fin-FET transistor, in accordance with an embodiment of the present invention.

Figure 3A:
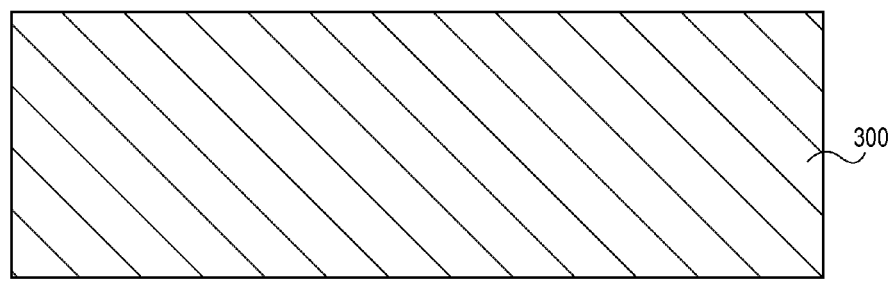
FIGS. 3A-3K illustrate cross-sectional view of various operations in a method of fabricating a vertical fin-FET transistor, in accordance with an embodiment of the present invention.
Figure 3B:
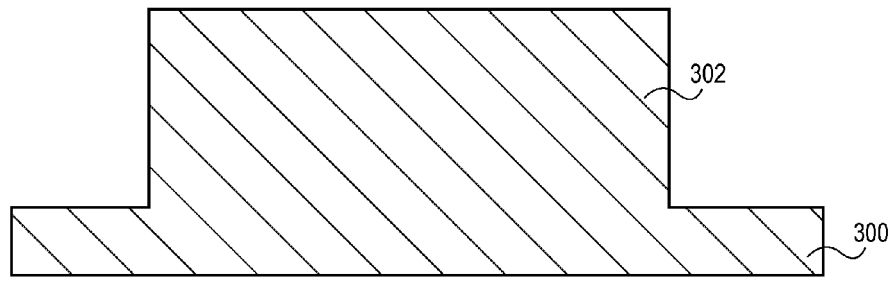

Referring collectively to FIGS. 3A and 3B, a bulk semiconductor substrate 300, such as a bulk single crystalline silicon substrate is provided having fins 302 etched therein (as shown length-wise, along an eventual source-drain perspective). In an embodiment, the fins 302 are formed directly in the bulk substrate 300 and, as such, are formed continuous with the bulk substrate 300. Artifacts remaining from the fabrication of fins 302 are not shown. For example, a hardmask layer, such as a silicon nitride hardmask layer, and a pad oxide layer, such as a silicon dioxide layer, may be removed from fins 302 following etching. In one embodiment, the bulk substrate 300 and, hence, the fins 302, are undoped or lightly doped at this stage. For example, in a particular embodiment, the bulk substrate 300 and, hence, the fins 302, have a concentration of less than approximately 1E17 atoms/cm$^3$ of boron dopant impurity atoms.

Substrate 300 may be composed of a semiconductor material that can withstand a manufacturing process and in which charge can migrate. In an embodiment, substrate 300 is a bulk substrate composed of a crystalline silicon, silicon/germanium or germanium layer. In one embodiment, the concentration of silicon atoms in bulk substrate 300 is greater than 97%. In another embodiment, bulk substrate 300 is composed of an epitaxial layer grown atop a distinct crystalline substrate, e.g. a silicon epitaxial layer grown atop a boron-doped bulk silicon mono-crystalline substrate. Bulk substrate 300 may alternatively be composed of a group III-V material. In an embodiment, bulk substrate 300 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. Alternatively, in place of a bulk substrate, a silicon-on-insulator (SOI) substrate may be used. The fins may be fabricated using a grating approach which may involve pitch halving or quartering in order to achieve high density fins.

Figure 3C:
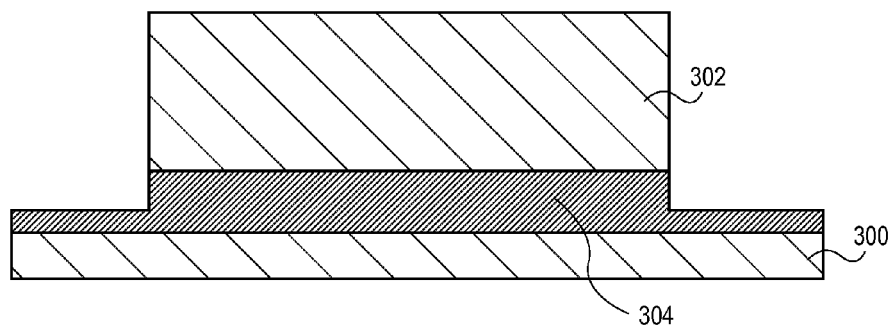

Referring to FIG. 3C, an N-subdoping region 304 is formed in fin 302. In an embodiment, the N-subdoping region 304 is formed by solid state diffusion using an N-type solid state dopant source layer. In one embodiment, the N-type solid state dopant source layer is a dielectric layer incorporating N-type dopants therein such as, but not limited to, a N-type doped oxide, nitride or carbide layer. In a specific such embodiment, the N-type solid state dopant source layer a phosphorous and/or arsenic-silicate glass layer. A drive-in anneal may be performed to provide the N-subdoping region 304. In this manner, the protruding portions of fins 302 above the N-subdoping region 304 remain undoped or lightly doped, e.g., essentially retaining the doping profile of the original bulk substrate 300 and fins 302 described in association with FIGS. 3A and 3B. In one embodiment, the N-subdoping region 304 has a total dopant concentration of 2E18 atoms/cm$^3$ or greater.

Figure 3D:
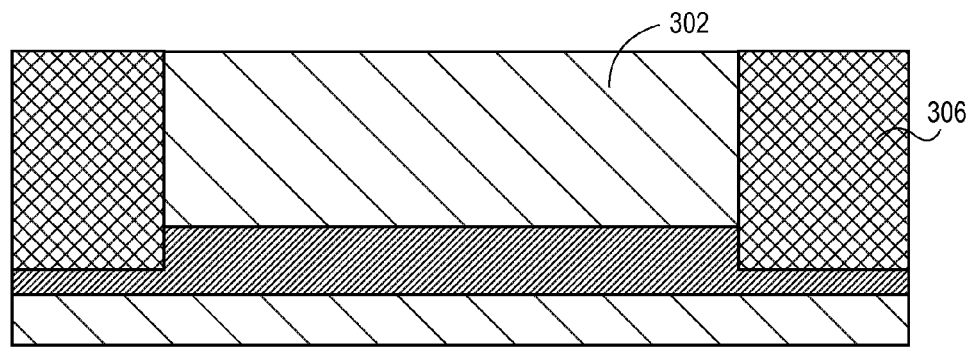

Referring to FIG. 3D, shallow trench isolation (STI) regions 306 are formed around the fin 302. In an embodiment, a dielectric fill layer is formed over the structure of FIG. 3C. In one embodiment, the dielectric fill layer is composed of silicon dioxide. The dielectric fill layer may be deposited by a chemical vapor deposition (CVD) or other deposition process (e.g., ALD, PECVD, PVD, HDP assisted CVD, low temp CVD). The dielectric fill layer is subsequently planarized to expose the top surface of the fin 302, as is depicted. The dielectric fill layer may be planarized by chemical mechanical polishing (CMP) techniques. In an alternative embodiment, a hardmask or other dielectric layer may be retained on top of the fins in order to eliminate or reduce gate control from the top of the fins (e.g., as in a double gate device versus a tri-gate device). In any case, the resulting STI regions 306 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 306 is composed of a dielectric material such as, but not limited to, silicon dioxide, silicon oxy-nitride, silicon nitride, or carbon-doped silicon nitride.

Figure 3E:
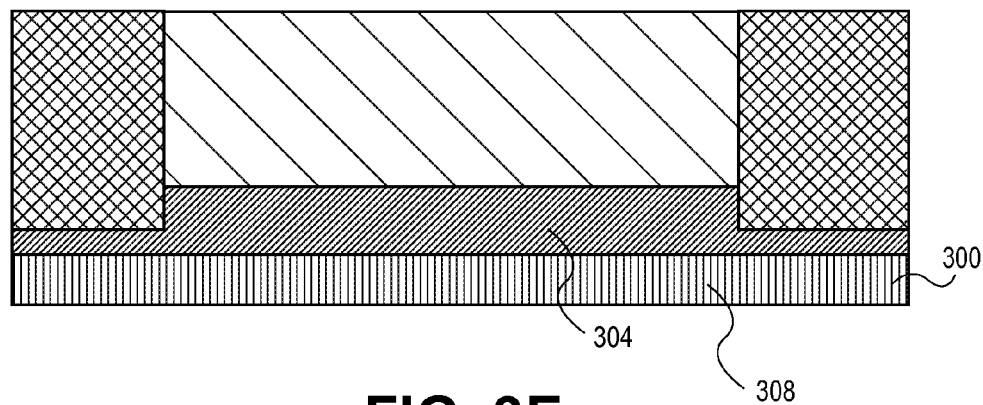
Figure 3F:
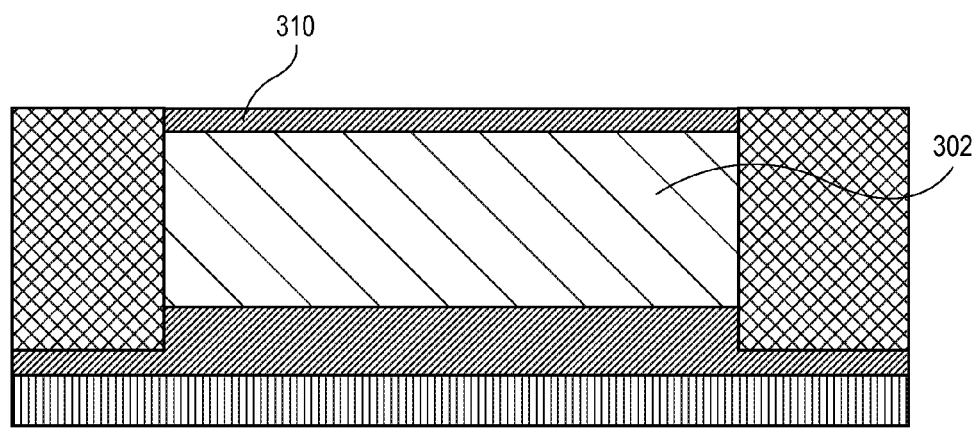

Referring to FIG. 3E, P-type dopants are introduced below the N-subdoping region 304 to form a P-isolation retro doping region 308 in substrate 300. In an embodiment, the P-type dopants are implanted to form the P-isolation retro doping region 308. Referring to FIG. 3F, an upper N-doping region 310, or top contact implant region, is formed in the upper portion of fin 302. In an embodiment, the N-type dopants are implanted to form the upper N-doping region 310.

Figure 3G:
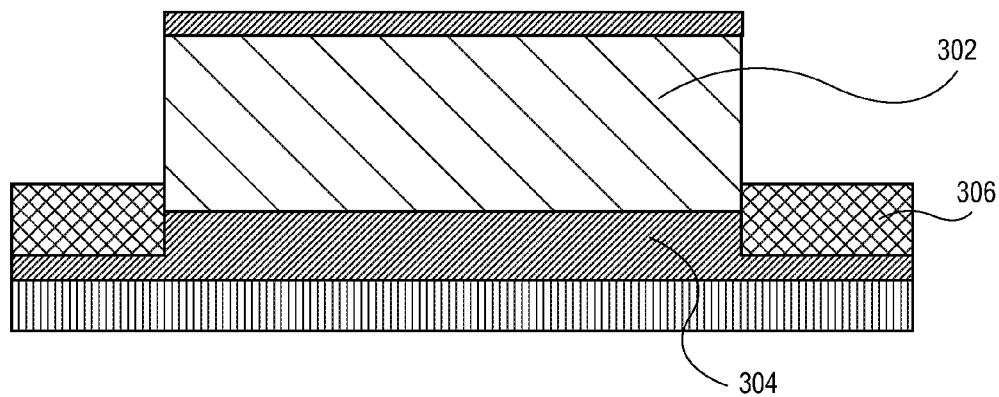

Referring to FIG. 3G, the STI regions 306 are recessed to expose protruding portions of the fins 302, defining the height (HSi) of the fin 302. The recessing may be performed by a plasma, vapor or wet etch process. In one embodiment, a dry etch process selective to silicon fins is used, the dry etch process based on a plasma generated from gases such as, but not limited to NF$_3$, CHF$_3$, C$_4$F$_8$, HBr and O$_2$ with typically pressures in the range of 30-100 mTorr and a plasma bias of 50-1000 Watts. In an embodiment, the recessing is halted above the N-subdoping region 304, as is depicted in FIG. 3G.

Figure 3H:
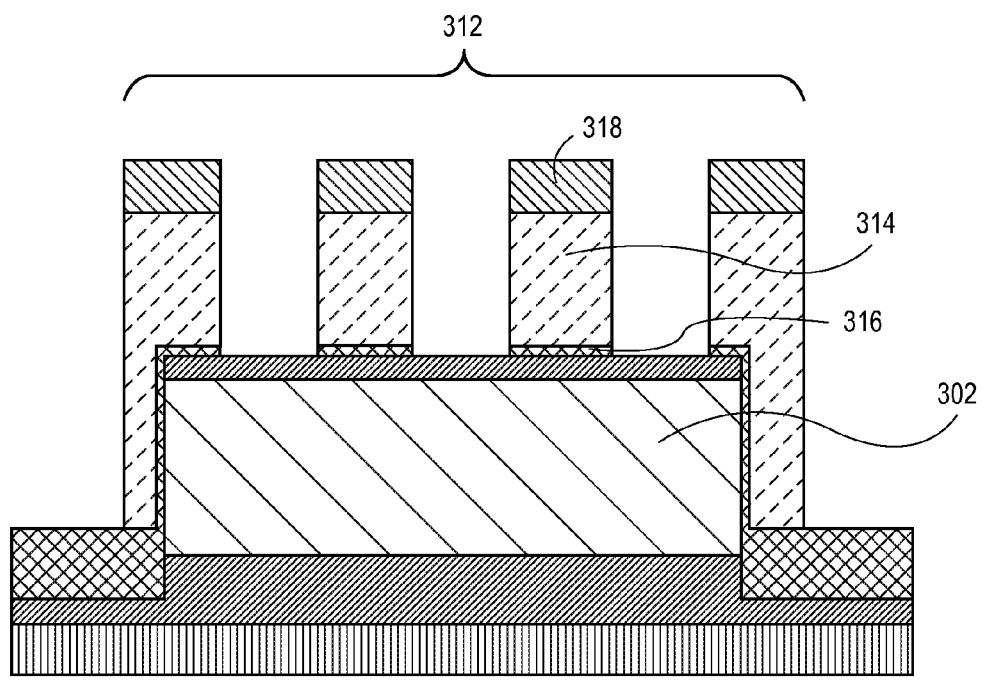

Referring to FIG. 3H, gate dielectric oxidation and polysilicon gate patterning is performed to provide gate lines 312 over fin 302. In addition to gate electrodes 314, the gate stack structure of each of the lines 312 may include a gate dielectric layer 316 and dielectric cap 318, as is depicted. In an embodiment, the gate lines 312 are formed to with the final, permanent, materials. In another embodiment, however, gate lines 312 will subsequently be used in a replacement gate process. In such a scheme, dummy gate material such as polysilicon or silicon nitride pillar material, may first be formed for later removal and replacement with permanent gate electrode material. In one such embodiment, a dummy gate dielectric layer is also formed in this process, for later removal and replacement with permanent gate dielectric material.

In an embodiment, the gate lines 312 are first formed by poly gate patterning involving poly lithography to define the poly gate by etch of a silicon nitride hardmask and polysilicon subsequently. In one embodiment, a mask is formed on the hardmask layer, the mask composed of a topographic masking portion and an anti-reflective coating (ARC) layer. In a particular such embodiment, the topographic masking portion is a carbon hardmask (CHM) layer and the anti-reflective coating layer is a silicon ARC layer. The topographic masking portion and the ARC layer may be patterned with conventional lithography and etching process techniques. In one embodiment, the mask also includes and uppermost photo-resist layer, as is known in the art, and may be patterned by conventional lithography and development processes. In a particular embodiment, the portions of the photo-resist layer exposed to the light source are removed upon developing the photo-resist layer. Thus, patterned photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra violet (EUV) resist, an e-beam imprint layer, or a phenolic resin matrix with a diazonaphthoquinone sensitizer. In another particular embodiment, the portions of the photo-resist layer exposed to the light source are retained upon developing the photo-resist layer. Thus, the photo-resist layer is composed of a negative photo-resist material. In a specific embodiment, the photo-resist layer is composed of a negative photo-resist material such as, but not limited to, consisting of poly-cis-isoprene or poly-vinyl-cinnamate.

Figure 3I:
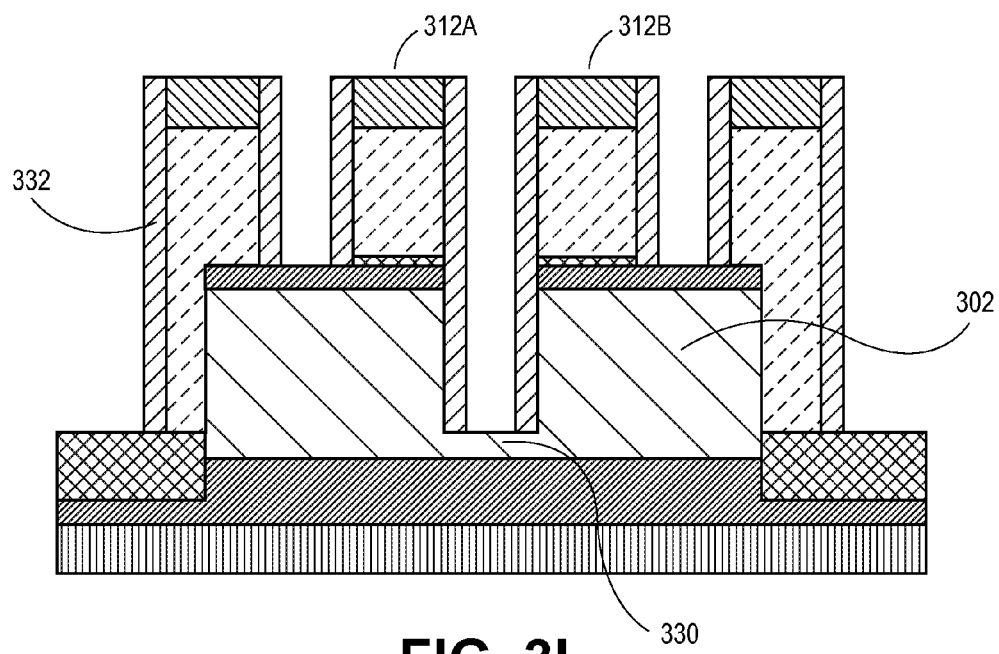

Referring to FIG. 3I, the fin 302 is patterned between gate lines 312A and 312B to form a recessed portion 330 of fin 302. The recessing may be performed by a lithography and etch process and may be based on a silicon dry or plasma etch process selective to the gate lines 312. In one such embodiment, the recessing of the fin 302 is halted above the N-subdoping region 304, as is depicted. Referring again to FIG. 3I, spacers 332 are formed along the sidewalls of the gate lines 312. Spacers associated with the gate lines 312 may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Figure 3J:
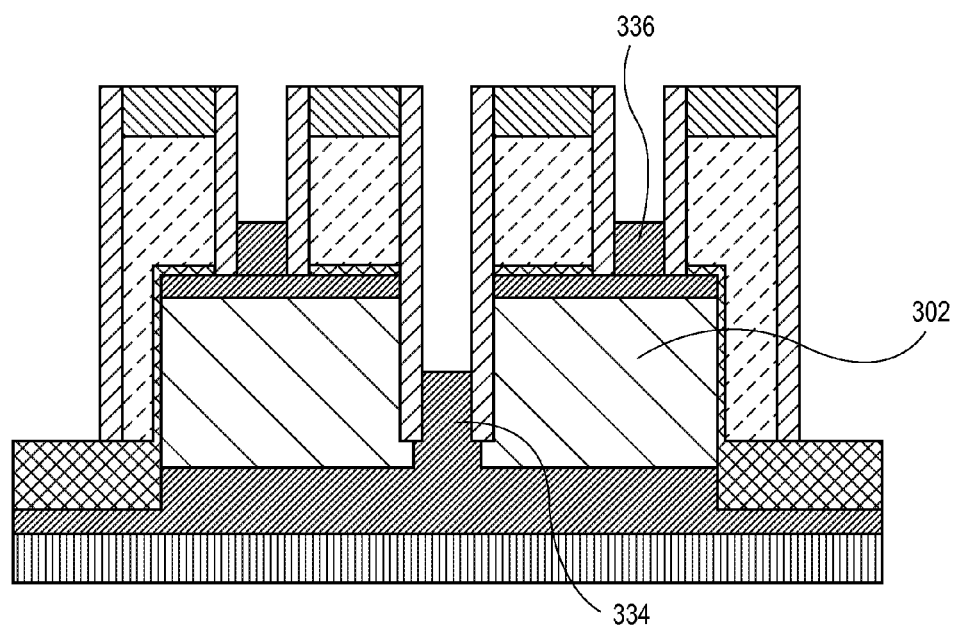

Referring to FIG. 3J, epitaxial regions 334 and 336 are formed on exposed regions of the fin 302. Specifically, epitaxial regions 334 is formed on the recessed portion 330 of the fin 302, while epitaxial region 336 is formed on the upper portions of the fin 302. In an embodiment, the epitaxial regions 334 and 336 are formed from a material similar to the material of fin 302, such as silicon. In other embodiments, different semiconductor materials may be used. In one specific embodiment, the epitaxial regions 334 and 336 are formed as doped regions, e.g., N-type doped regions 334 and 336 as depicted. In an embodiment, the epitaxial region 334 is a source region for a fabricated vertical fin-FET, while the epitaxial regions 336 are drain regions for the fabricated vertical fin-FET.

Figure 3K:
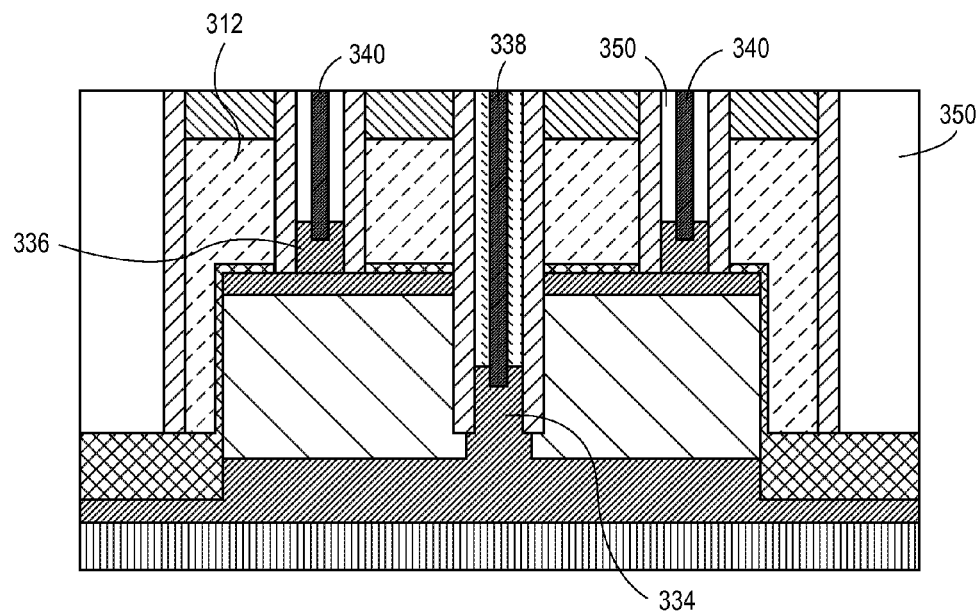

Referring to FIG. 3K, an isolation layer 350, such as a silicon dioxide inter-layer dielectric layer is formed over the structure of FIG. 3J. Contact formation, e.g., to form source contact 338 and drain contacts 340 is also performed. Additional processing may include gate and gate dielectric replacement processes. Further processing may also include gate contact formation, along with an overlying metal interconnect formation. Source contact 338 and drain contacts 340, and any gate contacts, may be composed of a metal species. The metal species may be a pure metal, such as tungsten, nickel, or cobalt, or may be an alloy such as a metal-metal alloy or a metal-semiconductor alloy (e.g., such as a silicide material).

As mentioned briefly above, a replacement gate process may be performed at approximately this stage of processing to form a vertical fin-FET transistor. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid. In an embodiment, a dummy gate dielectric layer is composed of silicon dioxide and is removed with hydrofluoric acid (HF).

In an embodiment, the permanent gate electrode of the gate electrode stack 212 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the fin 302. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment (although not shown), providing the device of FIG. 3K involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, one or more approaches described herein contemplate essentially a dummy and replacement gate process in combination with a dummy and replacement contact process to arrive at the device of FIG. 3K. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

With reference again to a device such as the device of FIG. 3K, in an embodiment, a contact structure is formed wherein portions of a gate electrode are contacted in regions where they are formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

Figure 4:
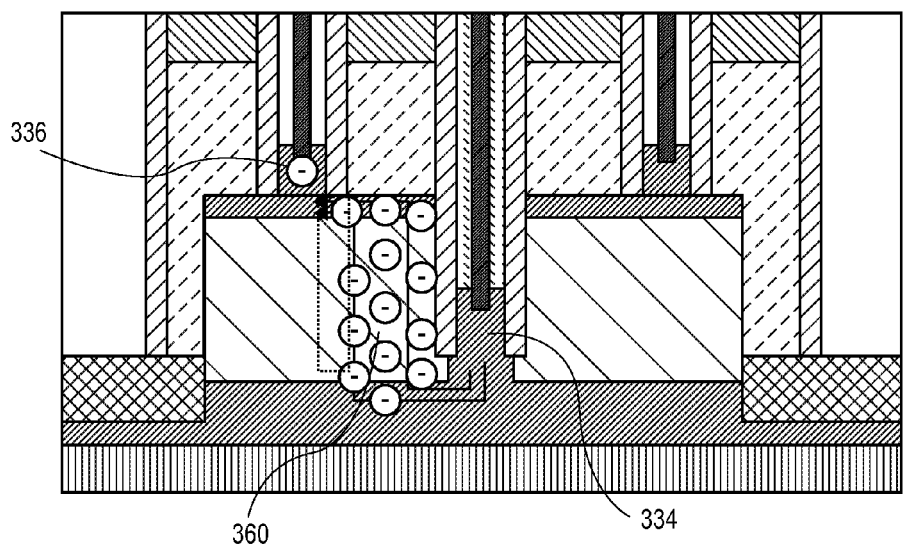
FIG. 4 illustrates operational current flow for the device of FIG. 3K, in accordance with an embodiment of the present invention.

In an aspect, current flow in a vertical fin-FET transistor is from a recessed portion of a fin to an upper portion of a fin. For example, FIG. 4 illustrates operational current flow for the device of FIG. 3K, in accordance with an embodiment of the present invention. Referring to FIG. 4, current flow is from lower source 334 to upper drain 336 and, as such, a vertical channel is formed.

It is to be understood that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node. In another embodiment, opposite to what is described above, the drain region is recessed deep into the fin relative to the source regions. Also, opposite to what is described above, in an embodiment, a P-type vertical fin-FET transistor may be fabricated. Overall, embodiments described herein provide approaches to fabricate vertical non-planar devices.

Figure 5:
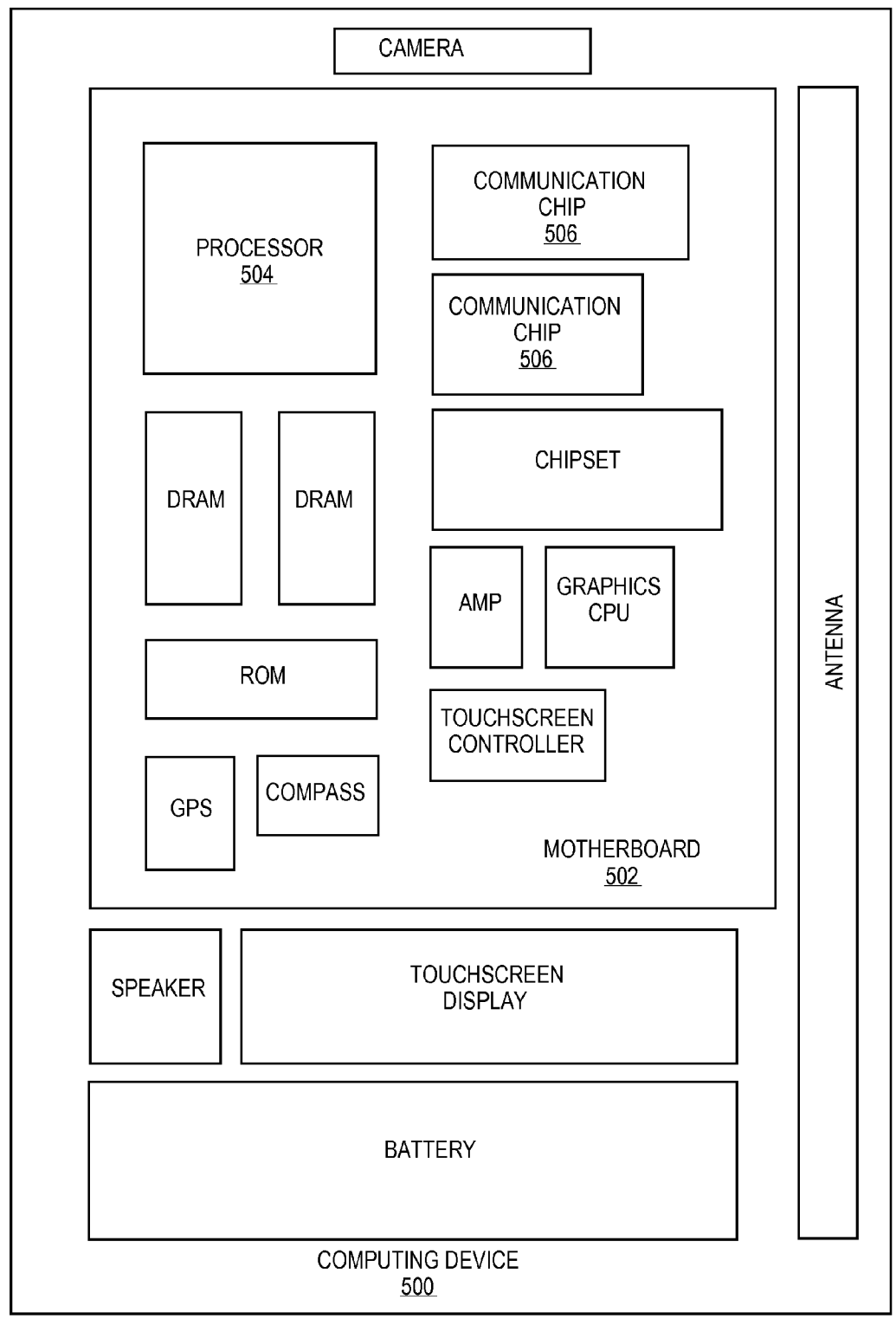
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of embodiments of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of embodiments of the invention.

In various embodiments, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, embodiments of the present invention include vertical non-planar semiconductor devices for system-on-chip (SoC) applications and methods of fabricating vertical non-planar semiconductor devices.

In an embodiment, a semiconductor device includes a semiconductor fin disposed above a substrate, the semiconductor fin having a recessed portion and an uppermost portion. A source region is disposed in the recessed portion of the semiconductor fin. A drain region is disposed in the uppermost portion of the semiconductor fin. A gate electrode is disposed over the uppermost portion of the semiconductor fin, between the source and drain regions.

In one embodiment, the semiconductor device further includes a substantially vertical channel region disposed between the source and drain regions and electrically controlled by the gate electrode.

In one embodiment, the drain region includes an upper doped region of a first conductivity type disposed in the uppermost region of the semiconductor fin, and the source region includes a lower doped region of the first conductivity type disposed in the semiconductor fin below the recessed portion of the semiconductor fin.

In one embodiment, the semiconductor fin is disposed on a bulk semiconductor substrate, and the lower doped region of the first conductivity type is further disposed in an upper portion of the bulk semiconductor substrate. The semiconductor device further includes a doped region of a second, opposite, conductivity type disposed in the bulk semiconductor substrate below, and in contact with, the lower doped region of the first conductivity type.

In one embodiment, the semiconductor device is an N-type device, and the first conductivity type is N-type.

In one embodiment, the drain region includes a first epitaxial region disposed on the uppermost portion of the semiconductor fin, and the source region includes a second epitaxial region disposed on the recessed portion of the semiconductor fin.

In one embodiment, the semiconductor fin includes another uppermost portion, and the recessed portion of the semiconductor fin is disposed between the uppermost portion and the other uppermost portion. The semiconductor device further includes a second drain region disposed in the other uppermost portion of the semiconductor fin. A second gate electrode is disposed over the other uppermost portion of the semiconductor fin, between the source region and the second drain region.

In one embodiment, the semiconductor device is a tri-gate device.

In an embodiment, an N-type vertical fin-FET device includes a silicon fin disposed on a bulk silicon substrate, the silicon fin having a recessed portion and an uppermost portion. A source region is disposed in the recessed portion of the silicon fin. A drain region is disposed in the uppermost portion of the silicon fin. An N-type gate electrode is disposed over the uppermost portion of the silicon fin, between the source and drain regions. A substantially vertical channel region is disposed between the source and drain regions and is electrically controlled by the N-type gate electrode.

In one embodiment, the drain region includes an upper N-type doped region disposed in the uppermost region of the silicon fin. The source region includes a lower N-type doped region disposed in the silicon fin, below the recessed portion of the silicon fin, and in an upper portion of the bulk silicon substrate.

In one embodiment, the N-type vertical fin-FET device further includes a P-type doped region disposed in the bulk silicon substrate below, and in contact with, the lower N-type doped region.

In one embodiment, the drain region further includes a first N-type epitaxial silicon region disposed on the uppermost portion of the silicon fin, and the source region further includes a second N-type epitaxial silicon region disposed on the recessed portion of the silicon fin.

In one embodiment, the silicon fin includes another uppermost portion. The recessed portion of the silicon fin is disposed between the uppermost portion and the other uppermost portion. The N-type vertical fin-FET device further includes a second drain region disposed in the other uppermost portion of the silicon fin. A second N-type gate electrode is disposed over the other uppermost portion of the silicon fin, between the source region and the second drain region.

In one embodiment, the N-type vertical fin-FET device is a tri-gate device.

In an embodiment, a method of fabricating a semiconductor device involves forming a semiconductor fin above a substrate. The method also involves forming a subdoping region of a first conductivity type in the bottom of the semiconductor fin. The method also involves forming an upper doping region of the first conductivity type in the top of the semiconductor fin, the upper doping region separated from the subdoping region. The method also involves forming a gate electrode over the semiconductor fin. The method also involves etching the semiconductor fin to provide a recessed portion and an uppermost portion of the semiconductor fin. The method also involves forming a source region in the recessed portion of the semiconductor fin, the source region including at least a portion of the subdoping region. The method also involves forming a drain region in the uppermost portion of the semiconductor fin, the drain region including at least a portion of the upper doping region. The gate electrode is between the source and drain regions.

In one embodiment, forming the semiconductor fin involves etching the semiconductor fin in the substrate. The method further involves forming a doped region of a second, opposite, conductivity type in the substrate below, and in contact with, the subdoping region of the first conductivity type.

In one embodiment, the method further involves, prior to forming the gate electrode, forming a shallow trench isolation (STI) region around the semiconductor fin and above the substrate. The semiconductor fin protrudes above the STI region.

In one embodiment, forming the source region further involves forming a first epitaxial region of the first conductivity type on the recessed portion of the semiconductor fin, and forming the drain region further involves forming a second epitaxial region of the first conductivity type on a portion of the uppermost portion of the semiconductor fin.

In one embodiment, forming the subdoping region involves using a solid-state doping source layer.

In one embodiment, forming the gate electrode involves forming a dummy gate electrode. The method further involves forming a permanent gate electrode by a replacement gate process.

In one embodiment, the method further involves forming an N-type vertical fin-FET device from the source region, the drain region, and the gate electrode.

In one embodiment, forming the N-type vertical fin-FET device involves forming a tri-gate device.

What is claimed is:

1. A semiconductor device, comprising:
    a semiconductor fin disposed above a substrate, the semiconductor fin having a recessed portion and an uppermost portion;
    a source region disposed in the recessed portion of the semiconductor fin;
    a drain region disposed in the uppermost portion of the semiconductor fin; and
    a gate electrode disposed over the uppermost portion of the semiconductor fin, between the source and drain regions.

2. The semiconductor device of claim 1, further comprising a substantially vertical channel region disposed between the source and drain regions and electrically controlled by the gate electrode.

3. The semiconductor device of claim 1, wherein the drain region comprises an upper doped region of a first conductivity type disposed in the uppermost region of the semiconductor fin, and the source region comprises a lower doped region of the first conductivity type disposed in the semiconductor fin below the recessed portion of the semiconductor fin.

4. The semiconductor device of claim 3, wherein the semiconductor fin is disposed on a bulk semiconductor substrate, and wherein the lower doped region of the first conductivity type is further disposed in an upper portion of the bulk semiconductor substrate, the semiconductor device further comprising:
    a doped region of a second, opposite, conductivity type disposed in the bulk semiconductor substrate below, and in contact with, the lower doped region of the first conductivity type.

5. The semiconductor device of claim 3, wherein the semiconductor device is an N-type device, and wherein the first conductivity type is N-type.

6. The semiconductor device of claim 1, wherein the drain region comprises a first epitaxial region disposed on the uppermost portion of the semiconductor fin, and the source region comprises a second epitaxial region disposed on the recessed portion of the semiconductor fin.

7. The semiconductor device of claim 1, wherein the semiconductor fin comprises another uppermost portion, and wherein the recessed portion of the semiconductor fin is disposed between the uppermost portion and the other uppermost portion, the semiconductor device further comprising:
    a second drain region disposed in the other uppermost portion of the semiconductor fin; and
    a second gate electrode disposed over the other uppermost portion of the semiconductor fin, between the source region and the second drain region.

8. The semiconductor device of claim 1, wherein the semiconductor device is a tri-gate device.

9. An N-type vertical fin-FET device, comprising:
    a silicon fin disposed on a bulk silicon substrate, the silicon fin having a recessed portion and an uppermost portion;
    a source region disposed in the recessed portion of the silicon fin;
    a drain region disposed in the uppermost portion of the silicon fin;
    an N-type gate electrode disposed over the uppermost portion of the silicon fin, between the source and drain regions; and
    a substantially vertical channel region disposed between the source and drain regions and electrically controlled by the N-type gate electrode.

10. The N-type vertical fin-FET device of claim 9, wherein the drain region comprises an upper N-type doped region disposed in the uppermost region of the silicon fin, and the source region comprises a lower N-type doped region disposed in the silicon fin, below the recessed portion of the silicon fin, and in an upper portion of the bulk silicon substrate.

11. The N-type vertical fin-FET device of claim 10, further comprising:
    a P-type doped region disposed in the bulk silicon substrate below, and in contact with, the lower N-type doped region.

12. The N-type vertical fin-FET device of claim 10, wherein the drain region further comprises a first N-type epitaxial silicon region disposed on the uppermost portion of the silicon fin, and the source region further comprises a second N-type epitaxial silicon region disposed on the recessed portion of the silicon fin.

13. The N-type vertical fin-FET device of claim 9, wherein the silicon fin comprises another uppermost portion, and wherein the recessed portion of the silicon fin is disposed between the uppermost portion and the other uppermost portion, the N-type vertical fin-FET device further comprising:
    a second drain region disposed in the other uppermost portion of the silicon fin; and
    a second N-type gate electrode disposed over the other uppermost portion of the silicon fin, between the source region and the second drain region.

14. The N-type vertical fin-FET device of claim 9, wherein the N-type vertical fin-FET device is a tri-gate device.

15. A method of fabricating a semiconductor device, the method comprising:
    forming a semiconductor fin above a substrate;
    forming a subdoping region of a first conductivity type in the bottom of the semiconductor fin;
    forming an upper doping region of the first conductivity type in the top of the semiconductor fin, the upper doping region separated from the subdoping region;
    forming a gate electrode over the semiconductor fin;
    etching the semiconductor fin to provide a recessed portion and an uppermost portion of the semiconductor fin;
    forming a source region in the recessed portion of the semiconductor fin, the source region comprising at least a portion of the subdoping region; and
    forming a drain region in the uppermost portion of the semiconductor fin, the drain region comprising at least a portion of the upper doping region, wherein the gate electrode is between the source and drain regions.

16. The method of claim 15, wherein forming the semiconductor fin comprises etching the semiconductor fin in the substrate, the method further comprising:
    forming a doped region of a second, opposite, conductivity type in the substrate below, and in contact with, the subdoping region of the first conductivity type.

17. The method of claim 15, further comprising:
prior to forming the gate electrode, forming a shallow trench isolation (STI) region around the semiconductor fin and above the substrate, wherein the semiconductor fin protrudes above the STI region.

18. The method of claim 15, wherein forming the source region further comprises forming a first epitaxial region of the first conductivity type on the recessed portion of the semiconductor fin, and wherein forming the drain region further comprises forming a second epitaxial region of the first conductivity type on a portion of the uppermost portion of the semiconductor fin.

19. The method of claim 15, wherein forming the sub-doping region comprises using a solid-state doping source layer.

20. The method of claim 15, wherein forming the gate electrode comprises forming a dummy gate electrode, the method further comprising:
forming a permanent gate electrode by a replacement gate process.

21. The method of claim 15, further comprising:
forming an N-type vertical fin-FET device from the source region, the drain region, and the gate electrode.

22. The method of claim 21, wherein forming the N-type vertical fin-FET device comprises forming a tri-gate device.

* * * * *